US009379348B2

(12) United States Patent
Kambe et al.

(10) Patent No.: US 9,379,348 B2
(45) Date of Patent: Jun. 28, 2016

(54) ORGANIC ELECTROLUMINESCENT ELEMENT, DISPLAY APPARATUS, AND MANUFACTURING METHOD OF ORGANIC ELECTROLUMINESCENT ELEMENT

(71) Applicant: JOLED Inc., Tokyo (JP)

(72) Inventors: Emiko Kambe, Kanagawa (JP); Masato Nakamura, Tokyo (JP)

(73) Assignee: JOLED Inc., Tokyo (JP)

( * ) Notice: Subject to any disclaimer, the term of this patent is extended or adjusted under 35 U.S.C. 154(b) by 0 days.

(21) Appl. No.: 14/611,851

(22) Filed: Feb. 2, 2015

(65) Prior Publication Data

US 2015/0228921 A1 Aug. 13, 2015

(30) Foreign Application Priority Data

Feb. 12, 2014 (JP) ................................ 2014-024667

(51) Int. Cl.

*H01L 29/08* (2006.01)
*H01L 35/24* (2006.01)
*H01L 51/00* (2006.01)
*H01L 51/50* (2006.01)
*H01L 51/56* (2006.01)

(52) U.S. Cl.

CPC ........ *H01L 51/5044* (2013.01); *H01L 51/5056* (2013.01); *H01L 51/56* (2013.01)

(58) Field of Classification Search

CPC ............ H01L 51/0085; H01L 51/5016; H01L 51/504; H01L 27/3209; H01L 2251/5384; H01L 2251/558; H01L 27/3206; H01L 51/5012; H01L 51/5036; H01L 51/5072; H01L 51/5203; H01L 51/5278; H01L 51/56; H01L 51/5044; H01L 51/5056

USPC ......... 257/40, 98, E21.158, E3.061, E51.022, 257/E51.024; 438/691, 29, 149, 98–99, 438/FOR. 157, FOR. 287

See application file for complete search history.

(56) References Cited

U.S. PATENT DOCUMENTS

2010/0145044 A1* 6/2010 Inoue et al. .................. 544/225

FOREIGN PATENT DOCUMENTS

JP 2003-272860 A 9/2003
JP 2005-267990 9/2005
JP 2010-015787 1/2010
JP 2010-129301 6/2010

* cited by examiner

*Primary Examiner* — Thao X Le
*Assistant Examiner* — Nduka Ojeh
(74) *Attorney, Agent, or Firm* — Michael Best and Friedrich

(57) ABSTRACT

There is provided an organic electroluminescent element including a plurality of light-emitting units including at least a first light-emitting unit containing at least a first light-emitting layer, and a second light-emitting unit containing at least a second light-emitting layer, and a charge generating layer disposed between the first light-emitting unit and the second light-emitting unit. The first light-emitting unit is disposed between an anode and a cathode. The second light-emitting unit is disposed between the first light-emitting unit and the cathode. A film thickness of a hole transport layer in the second light-emitting unit is not less than 10% and not more than 25% to a total film thickness of the second light-emitting unit.

20 Claims, 2 Drawing Sheets

155
153
151
150
143
141
140
137
135
133
131
130

ORGANIC ELECTROLUMINESCENT ELEMENT, DISPLAY APPARATUS, AND MANUFACTURING METHOD OF ORGANIC ELECTROLUMINESCENT ELEMENT

CROSS REFERENCE TO RELATED APPLICATIONS

This application claims the benefit of Japanese Priority Patent Application JP 2014-024667 filed Feb. 12, 2014, the entire contents of which are incorporated herein by reference.

BACKGROUND

The present disclosure relates to an organic electroluminescent element, a display apparatus, and a manufacturing method of the organic electroluminescent element.

An organic electroluminescent element (a so-called organic EL element) is a self light-emitting-type element having a light-emitting layer containing an organic compound between an anode and a cathode. In such an organic electroluminescent element, when a voltage is applied between an anode and a cathode, holes injected from an anode move to a light-emitting layer through a hole transport layer, while electrons injected from a cathode move to the light-emitting layer through an electron transport layer. Then, recombination of the holes and electrons that have moved to the light-emitting layer generates an exciton, and transition of the generated exciton to a ground state causes light-emitting to occur.

Here, it is desired that the organic electroluminescent element used as a light source of a display apparatus and a lighting apparatus have high light-emitting efficiency.

For example, JP 2003-272860A, JP 2010-15787A and JP 2005-267990A disclose a technique of adopting a multi-stack structure in which a plurality of light-emitting units is laminated to each other through a charge generating layer in the organic electroluminescent element in order to improve light-emitting efficiency.

However, in the organic electroluminescent element having the multi-stack structure, while current efficiency can be improved by laminating a plurality of light-emitting units, an applied voltage causes a light-emitting balance of the units to change, resulting in a change in color taste of the light.

To address this concern, JP 2010-129301A discloses a technique of controlling the arrangement order of the light-emitting layers based on the light-emitting peak wavelength so that a light-emitting layer farther from an anode has a higher highest occupied molecular orbital (HOMO) and lowest unoccupied molecular orbital (LUMO), thereby to suppress the change in color taste of emitted light.

SUMMARY

However, in the technique disclosed in JP 2010-129301A, it has been difficult to sufficiently suppress the change in color taste of emitted light due to the change in applied voltage. Also, in the technique disclosed in JP 2010-129301A, the order of the light-emitting units to be laminated has been limited, making it difficult to optimize the light extraction of the organic electroluminescent element.

To address this concern, the present disclosure proposes a novel and improved organic electroluminescent element, display apparatus, and manufacturing method of the organic electroluminescent element, in which light extraction in an organic electroluminescent element is easily optimized, and the change in color taste of emitted light due to an applied voltage can be suppressed.

According to an embodiment of the present disclosure, there is provided an organic electroluminescent element including a plurality of light-emitting units including at least a first light-emitting unit containing at least a first light-emitting layer, and a second light-emitting unit containing at least a second light-emitting layer, and a charge generating layer disposed between the first light-emitting unit and the second light-emitting unit. The first light-emitting unit is disposed between an anode and a cathode. The second light-emitting unit is disposed between the first light-emitting unit and the cathode. A film thickness of a hole transport layer in the second light-emitting unit is not less than 10% and not more than 25% to a total film thickness of the second light-emitting unit.

According to another embodiment of the present disclosure, there is provided a display apparatus containing the above organic electroluminescent element.

According to another embodiment of the present disclosure, there is provided a manufacturing method of an organic electroluminescent element, the method including disposing, on an anode, a first light-emitting unit containing at least a first light-emitting layer, disposing, on the first light-emitting unit, a charge generating layer, disposing, on the charge generating layer, a second light-emitting unit containing at least a second light-emitting layer, and disposing, on the second light-emitting unit, a cathode. A film thickness of a hole transport layer in the second light-emitting unit is formed as being not less than 10% and not more than 25% to a total film thickness of the second light-emitting unit.

According to the present disclosure, supply of electrons to the first light-emitting layer can be prevented from being inhibited by the hole transport layer in the second light-emitting layer.

As described above, according to the present disclosure, light extraction in an organic electroluminescent element is easily optimized, and the change in color taste of emitted light due to an applied voltage can be suppressed.

Note that the above effects are not necessarily limiting. One of the effects indicated in this specification or other effects that can be understood from this specification may be exerted in addition to the above-described effects or in place of the above-described effects.

DETAILED DESCRIPTION OF THE EMBODIMENT(S)

Figure 1:
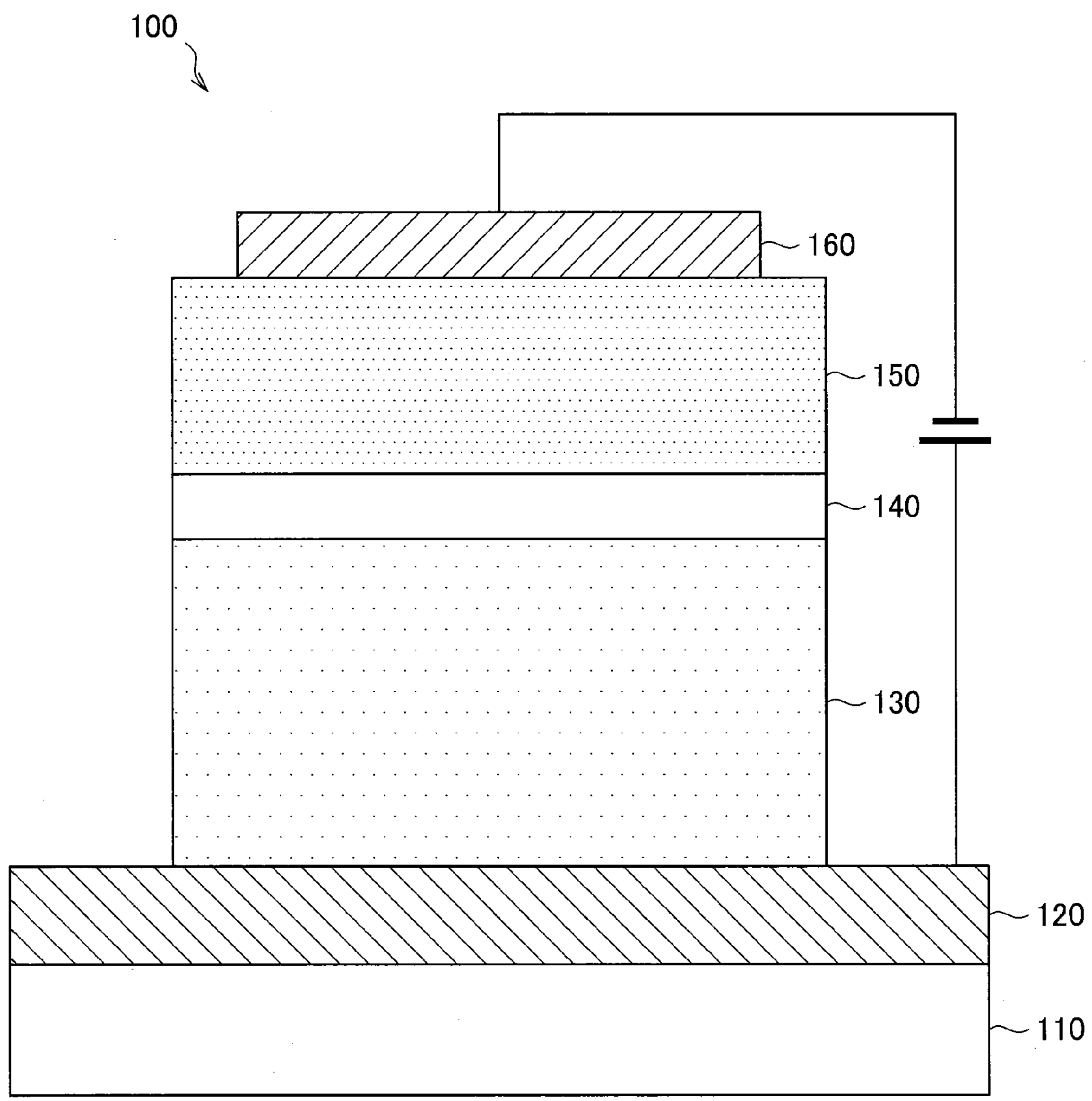
FIG. 1 is an illustrative diagram illustrating an example of the organic electroluminescent element according to an embodiment of the present disclosure.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that description will be provided in the following order.

1. General outline of organic electroluminescent element
2. Structure of organic electroluminescent element
3. Production method of organic electroluminescent element
4. Examples

1. GENERAL OUTLINE OF ORGANIC ELECTROLUMINESCENT ELEMENT

First, the general outline of the organic electroluminescent element according to an embodiment of the present disclosure will be described with reference to FIG. 1. FIG. 1 is an illustrative diagram illustrating an example of the organic electroluminescent element according to an embodiment of the present disclosure.

The organic electroluminescent element according to an embodiment of the present disclosure is an organic electroluminescent element having a multi-stack structure, and includes at least two or more light-emitting units. Also, the light-emitting units are laminated to each other with a charge generating layer disposed between the light-emitting units.

Specifically, as illustrated in FIG. 1, an organic electroluminescent element 100 according to an embodiment of the present disclosure includes a substrate 110, an anode 120 disposed on the substrate 110, a first light-emitting unit 130 disposed on the anode 120, a charge generating layer 140 disposed on the first light-emitting unit 130, a second light-emitting unit 150 disposed on the charge generating layer 140, and a cathode 160 disposed on the second light-emitting unit 150.

Note that as described herein, the expression of "a B layer disposed on an A layer" is assumed to include not only the case where a B layer is disposed directly on an A layer, but also the case where one or more layers different from a B layer are disposed directly on an A layer with a B layer disposed on the disposed one or more layers.

The substrate 110 is a support on which the layers constituting the organic electroluminescent element 100 are laminated and disposed. A substrate usually used in an organic electroluminescent element can be used as the substrate 110. Examples of the substrate 110 may include various glass substrates such as a high-strain point glass substrate, a soda glass substrate and a borosilicate glass substrate, a quartz substrate, a semiconductor substrate, and plastic substrates such as polymethyl methacrylate, polyvinyl alcohol, polyimide and polycarbonate.

The anode 120 is an electrode used for injecting holes into the first light-emitting unit 130. Specifically, the anode 120 is formed of metal, metal alloy, conductive compounds and the like each having a high work function. For example, the anode 120 may be formed of metal or metal alloy such as platinum (Pt), gold (Au), silver (Ag), chromium (Cr), tungsten (W), nickel (Ni), copper (Cu), iron (Fe), cobalt (Co) and tantalum (Ta), or may be formed of indium tin oxide (ITO), indium zinc oxide (IZO), tin oxide ($SnO_2$), zinc oxide (ZnO), and the like. The anode 120 may also be formed of magnesium (Mg), aluminum (Al) and the like each having a low work function. However, in such a case, it is preferred that an appropriate hole injection layer is disposed to improve hole injection properties.

The first light-emitting unit 130 and the second light-emitting unit 150 provide a place where holes and electrons are recombined thereby to emit light. Although each of the first light-emitting unit 130 and the second light-emitting unit 150 may be formed with a plurality of layers, the first light-emitting unit 130 has at least a first light-emitting unit, and the second light-emitting unit 150 has at least a second light-emitting unit. Note that the laminated structure of each of the first light-emitting unit 130 and the second light-emitting unit 150 will be described later with reference to FIG. 2.

The charge generating layer 140 performs the function of, during voltage application, injecting holes into a layer disposed on a side of the cathode 160 to the charge generating layer 140, and injecting electrons into a layer disposed on a side of the anode 120 to the charge generating layer 140. Such a charge generating layer 140 is useful when achieving the multi-stack type organic electroluminescent element 100 in which the charge generating layer 140 is disposed between two light-emitting units (that is, the first light-emitting unit 130 and the second light-emitting unit 150). Note that the structure of the charge generating layer 140 will be described later with reference to FIG. 2.

The cathode 160 is an electrode used for injecting electrons into the second light-emitting unit 150. Specifically, the cathode 160 is formed of metal, metal alloy, conductive compounds and the like each having a low work function. For example, the cathode 160 may be formed of metal or metal alloy such as magnesium (Mg), aluminum (Al), silver (Ag), calcium (Ca) and strontium (Sr), or may be formed of indium tin oxide (ITO), indium zinc oxide (IZO), tin oxide ($SnO_2$), zinc oxide (ZnO) and the like. When the cathode 160 is formed of transparent electrode materials such as ITO and IZO, it is preferred that an appropriate barrier removal layer is provided in order to improve electron injection properties.

Here, the organic electroluminescent element 100 according to an embodiment of the present disclosure is used in, for example, a display apparatus or a lighting device. For this reason, the organic electroluminescent element 100 preferably emits white light.

According to the organic electroluminescent element 100 according to an embodiment of the present disclosure, the laminated first light-emitting unit 130 and second light-emitting unit 150 emit light with wavelengths different from each other, thereby enabling white light to be emitted as a whole of the organic electroluminescent element 100. Specifically, the first light-emitting unit 130 and the second light-emitting unit 150 may emit light with wavelengths corresponding to colors complementary to each other (for example, blue and yellow, red and green, etc.), thereby enabling white light to be emitted as a whole of the organic electroluminescent element 100.

However, in such an organic electroluminescent element 100, there has been a problem that when the applied voltage is low, the balance of the light-emitting amount between the first light-emitting unit 130 and the second light-emitting unit 150 varies, causing the color taste of the emitted light color of the organic electroluminescent element 100 to change.

As a result of intensive researches on the above-described problems, the present inventor found that in the light-emitting in a low current density (that is, when the applied voltage is low) where the supply of holes tends to be excessive while the supply of electrons is likely to be insufficient, the supply of electrons into the first light-emitting unit 130 is performed not only from the charge generating layer 140 but also from the cathode 160. The present inventor also found that in such light-emitting in a low current density, the hole transport layer in the second light-emitting unit 150 inhibits the supply of electrons into the first light-emitting unit 130.

Accordingly, the present inventor has arrived at the organic electroluminescent element 100 based on the above-described knowledge. In the organic electroluminescent element 100 according to an embodiment of the present disclosure, the thickness of the hole transport layer in the second light-emitting unit 150 is not less than 10% and not more than 25% to the total film thickness of the second light-emitting unit 150. Such a structure enables the organic electroluminescent element 100 according to an embodiment of the present disclosure to suppress the supply of electrons into the first light-emitting unit 130 from being inhibited by the hole transport layer in the second light-emitting unit 150, thus preventing the color taste of the emitted light color of the organic electroluminescent element 100 in a low current density from changing.

Also, the organic electroluminescent element 100 according to an embodiment of the present disclosure can prevent the change in color taste of the emitted light color merely by controlling the film thickness of the hole transport layer in the second light-emitting unit 150. Therefore, in the organic electroluminescent element 100 according to an embodiment of the present disclosure, the laminating order of the light-emitting layers does not have to be considered. Thus, the light extraction in the organic electroluminescent element can be easily optimized.

Note that the organic electroluminescent element 100 according to an embodiment of the present disclosure may further include a third light-emitting unit disposed between the second light-emitting unit 150 and the cathode 160, and a charge generating layer disposed between the second light-emitting unit 150 and the third light-emitting unit. In such a case, for example, the first to third light-emitting units may emit light with wavelengths corresponding to red, blue and green respectively, thereby enabling white light to be emitted as a whole of the organic electroluminescent element 100.

Also, in such a case, the thickness of the hole transport layer in the third light-emitting unit is, similarly to in the second light-emitting unit, preferably not less than 10% and not more than 25% to the total film thickness of the third light-emitting unit. According to the above-described structure, the organic electroluminescent element 100 according to an embodiment of the present disclosure can further improve the supply of electrons into the first light-emitting unit, thus preventing the change in color taste of the emitted light color of the organic electroluminescent element 100 in a low current density.

2. STRUCTURE OF ORGANIC ELECTROLUMINESCENT ELEMENT

Figure 2:
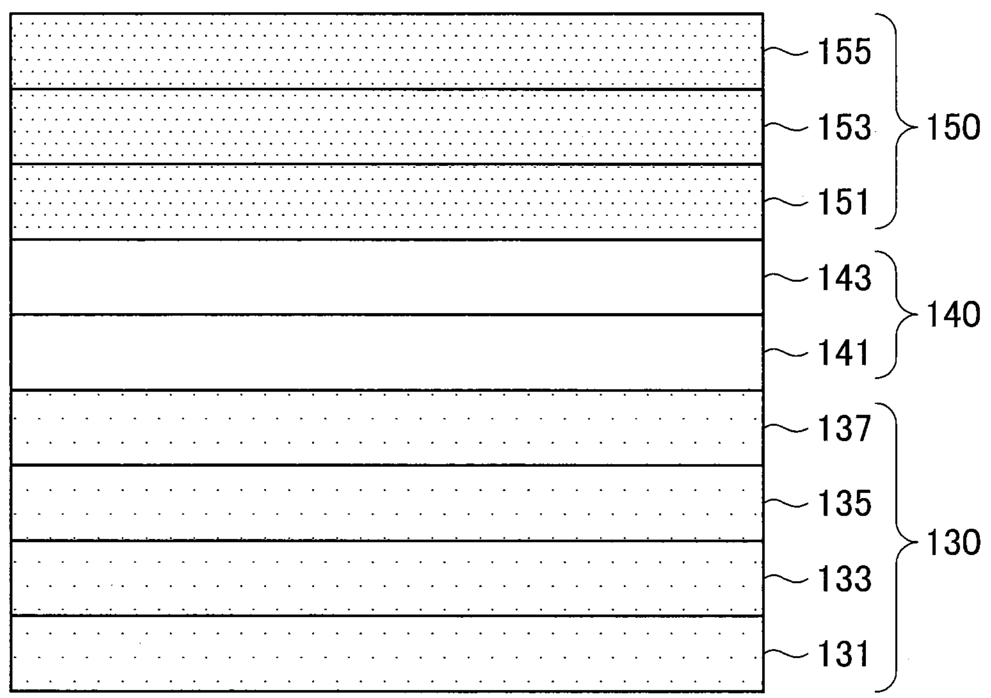
FIG. 2 is an illustrative diagram illustrating a laminated structure of a first light-emitting unit, a charge generating layer and a second light-emitting unit.

Next, with reference to FIG. 2, the structures of the first light-emitting unit 130, the charge generating layer 140 and the second light-emitting unit 150 which are characteristic in the organic electroluminescent element 100 according to an embodiment of the present disclosure will be described. FIG. 2 is an illustrative diagram illustrating the laminated structure of the first light-emitting unit 130, the charge generating layer 140 and the second light-emitting unit 150.

As illustrated in FIG. 2, the first light-emitting unit 130 includes a hole injection layer 131, a first hole transport layer 133 disposed on the hole injection layer 131, a first light-emitting layer 135 disposed on the first hole transport layer 133, an electron transport layer 137 disposed on the first light-emitting layer 135. Also, the charge generating layer 140 includes a mixture layer 141 disposed on the electron transport layer 137, and an acceptor layer 143 disposed on the mixture layer 141. Furthermore, the second light-emitting unit 150 includes a second hole transport layer 151 disposed on the acceptor layer 143, a second light-emitting layer 153 disposed on the second hole transport layer 151, an electron injection barrier removal layer 155 disposed on the second light-emitting layer 153.

Note that as described with reference to FIG. 1, although not illustrated in FIG. 2, the hole injection layer 131 is disposed on the anode 120, and the cathode 160 is disposed on the electron injection barrier removal layer 155.

Each of the hole injection layer 131, the first hole transport layer 133 and the second hole transport layer 151 is a layer that performs the function of increasing the hole injection efficiency into the first light-emitting layer 135 or the second light-emitting layer 153. Examples of a compound to be used for the formation of the hole injection layer 131, the first hole transport layer 133 and the second hole transport layer 151 may include benzine, styrylamine, triphenylamine, porphyrin, triphenylene, azatriphenylene, tetracyanoquinodimethane, triazole, imidazole, oxadiazole, polyarylalkane, phenylenediamine, arylamine, oxazole, anthracene, fluorenone, hydrazone, stilbene, or derivatives thereof. Also, as materials of the hole injection layer 131, the first hole transport layer 133 and the second hole transport layer 151, there can be used heterocyclic conjugated monomers, oligomers or polymers such as polysilane-based compounds, vinylcarbazole-based compounds, thiophene-based compounds and aniline-based compounds.

Examples of a specific compound that forms the hole injection layer 131, the first hole transport layer 133 and the second hole transport layer 151 may include α-naphthyl phenyl phenylenediamine (α-NPD), porphyrin, metal tetraphenylporphyrin, metal naphthalocyanine, hexacyanoazatriphenylene (HAT), 7,7,8,8-tetracyanoquinodimethane (TCNQ), 7,7,8,8-tetracyano-2,3,5,6-tetrafluoroquinodimethane (F4-TCNQ), tetracyano 4,4,4-tris(3-methylphenylphenylamino)triphenylamine, N,N,N',N'-tetrakis(p-tolyl)p-phenylenediamine, N,N,N',N'-tetraphenyl-4,4'-diaminobiphenyl, N-phenylcarbazole, 4-di-p-tolylaminostilbene, poly(para phenylene vinylene), poly(thiophene vinylene), and poly(2,2'-thienyl pyrrole).

Here, the thickness of the second hole transport layer 151 is not less than 10% and not more than 25% to the total film thickness of the second light-emitting unit 150. When the film thickness of the second hole transport layer 151 is in the above-described range, supply of electrons into the first light-emitting unit can be suppressed from being inhibited by the second hole transport layer 151, thus preventing the change in color taste of the emitted light color of the organic electroluminescent element 100 in a low current density. Note that the total film thickness of the second light-emitting unit 150 is defined as a sum of the film thicknesses of the second hole transport layer 151, the second light-emitting layer 153 and the electron injection barrier removal layer 155.

That is, when the film thickness of the second hole transport layer 151 exceeds 25% to the total film thickness of the second light-emitting unit 150, supply of electrons into the first light-emitting unit is inhibited by the second hole transport layer 151, thus causing the color taste of the emitted light color of the organic electroluminescent element 100 to change in a low current density. On the other hand, when the film thickness of the second hole transport layer 151 is less than 10% to the second light-emitting unit 150, it is difficult for the second hole transport layer 151 to perform the original function of improving the hole injection efficiency into the second light-emitting layer 153.

Also, the film thickness of the second hole transport layer 151 may more specifically be not less than 3 nm and not more than 15 nm. When the film thickness of the second hole transport layer 151 is in the above-described range, supply of electrons into the first light-emitting unit can be further suppressed from being inhibited by the second hole transport layer 151. Therefore, the organic electroluminescent element 100 according to an embodiment of the present disclosure can further prevent the change in color taste of the emitted light color of the organic electroluminescent element 100 in a low current density.

The first light-emitting layer 135 and the second light-emitting layer 153 are each a layer having the function of providing a place where holes and electrons are recombined thereby to emit light. Specifically, the first light-emitting layer 135 and the second light-emitting layer 153 are each constituted by containing a light-emitting material (a dopant) in a host material.

Examples of the host material may include styryl derivatives, anthracene derivatives, naphthacene derivatives, carbazole derivatives or aromatic amines, phenanthroline derivatives, triazole derivatives, quinolinolato-based metal complexes, and phenanthroline derivatives. Also, the host material is particularly preferably at least one selected from distyl derivatives, tristyl derivatives, tetrastyl derivatives, styryl amine derivatives and carbazole derivatives.

Also, as the light-emitting material (dopant), a known fluorescent material and phosphorescent material can be used. The fluorescent material to be used may be appropriately selected from laser pigments such as styrylbenzene-based pigments, oxazole-based pigments, perylene-based pigments, coumarin-based pigments and acridine-based pigments; polyaromatic hydrocarbon-based materials such as anthracene derivatives, naphthacene derivatives, pentacene derivatives and chrysene derivatives; and fluorescent materials such as pyrromethene skeleton compounds or metal complexes, quinacridone derivatives, cyanomethylenepyran-based derivatives (DCM, DCJTB), benzothiazole-based compounds, benzoimidazole-based compounds and metal chelating oxinoid compounds.

Also, as the phosphorescent material, a material containing an organic metal complex that includes at least one metal selected from ruthenium, rhodium, palladium, silver, rhenium, osmium, iridium, platinum and gold is preferred. These organic metal complexes are known in the previously described patent documents or the like, and can be selected and used. Note that examples of a preferred phosphorescent material may include complexes such as $Ir(ppy)_3$ having a precious metal element such as Ir as a central metal, complexes such as $Ir(bt)_2.acac_3$, and complexes such as $PtOEt_3$. Specific examples of these complexes will be indicated below, but not limited to the below-described compounds.

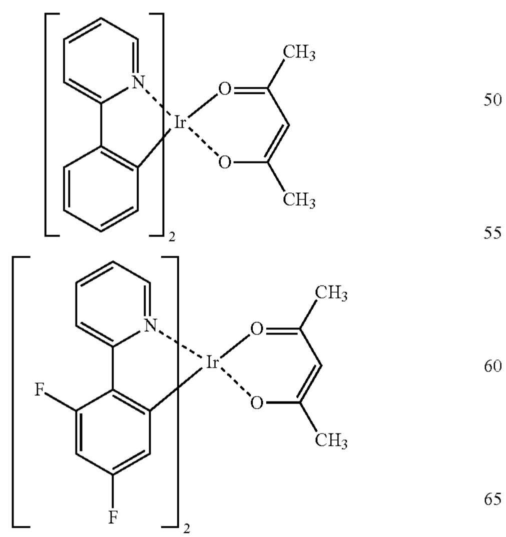

-continued

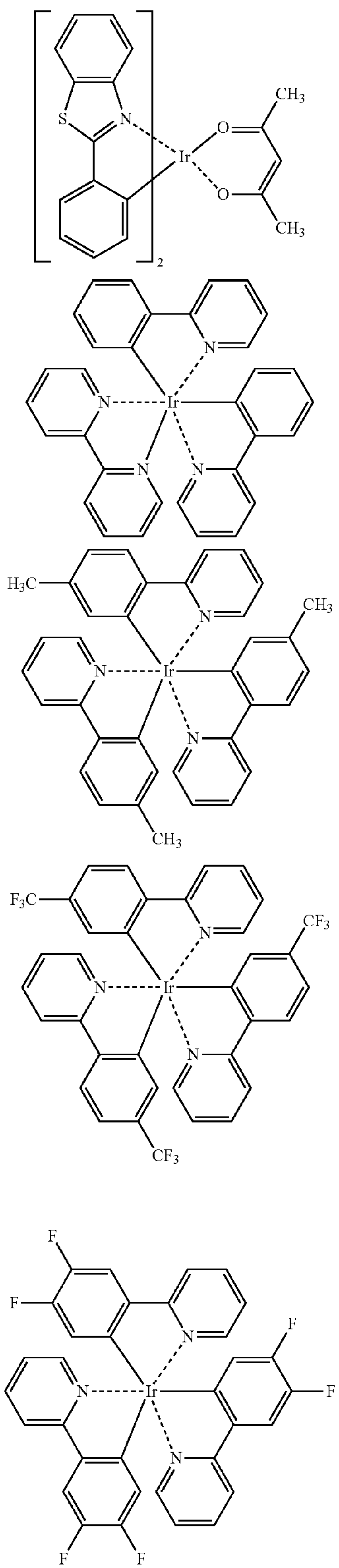

-continued

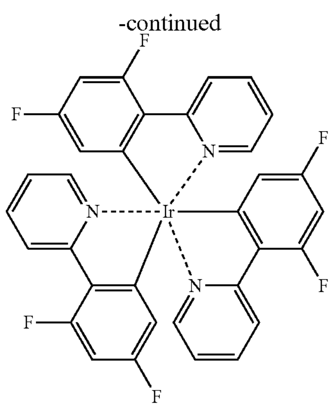

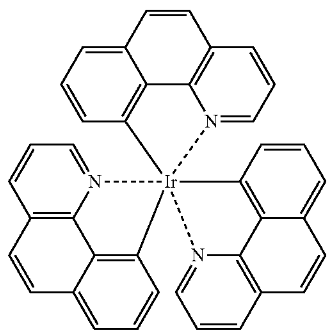

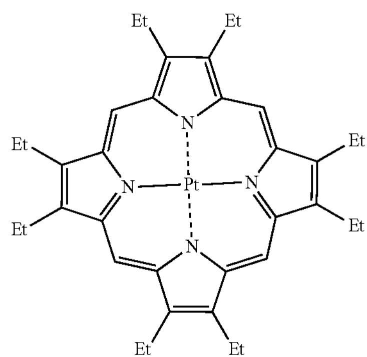

Also, in the organic electroluminescent element 100 according to an embodiment of the present disclosure, the first light-emitting layer 135 and the second light-emitting layer 153 preferably have light-emitting wavelengths different from each other, and more preferably has light-emitting wavelengths corresponding to colors complementary to each other (for example, blue and yellow, red and green). According to such a structure, the organic electroluminescent element 100 according to an embodiment of the present disclosure can emit white light as a whole of the organic electroluminescent element 100 by superimposing the lights emitted by the first light-emitting layer 135 and the second light-emitting layer 153 on each other.

Furthermore, more specifically, the first light-emitting layer 135 is preferably a blue light-emitting layer, and the second light-emitting layer 153 is preferably a yellow light-emitting layer. Since holes are injected into the first light-emitting layer 135 from the anode 120 having higher hole injection ability than the charge generating layer 140, holes are more likely to be injected into the first light-emitting layer 135 than into the second light-emitting layer 153. For this reason, the first light-emitting layer 135 is preferably configured as a blue light-emitting layer which has high electron transport properties and which holes are unlikely to enter due to the characteristics of the light-emitting material, and the second light-emitting layer 153 is preferably configured as a yellow light-emitting layer.

For example, the first light-emitting layer 135 may be formed as a blue light-emitting layer that contains Compound B1 below as a host material and Compound B2 below as a dopant.

Compound B1

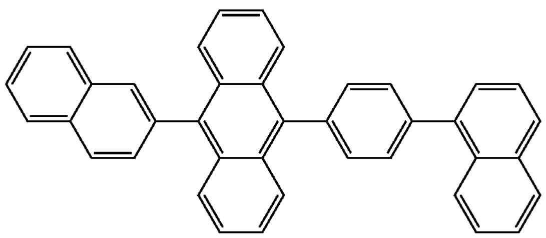

Compound B2

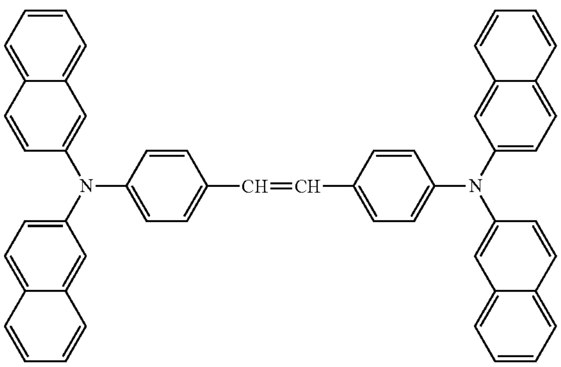

Also, the second light-emitting layer 153 may be formed as a yellow light-emitting layer having a laminated structure that includes: a layer containing N,N'-dicarbazoyl-4,4'-biphenyl (CBP) below as a host material and containing $Ir(bzq)_3$ below as a dopant so as to have a film thickness ratio of 5%; and a layer containing CBP below.

CBP

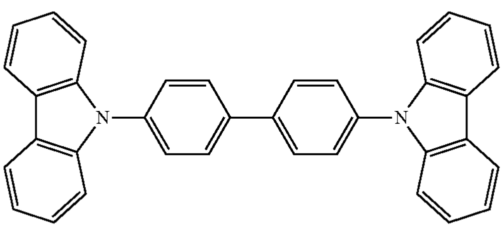

-continued

Ir(bzq)3

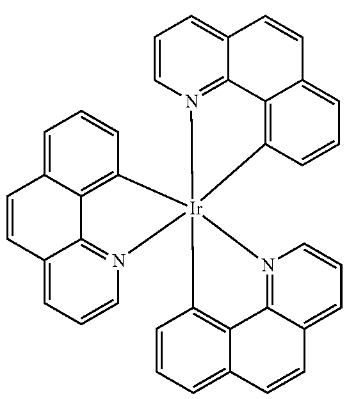

The electron transport layer 137 is a layer that performs the function of increasing the electron injection efficiency into the first light-emitting layer 135. An example of a compound to be used for formation of the electron transport layer 137 may include a compound that has anthracene derivatives, phenanthroline derivatives, silole derivatives or azaaryl skeleton, and contains a metal and an oxide, composite oxide and fluoride material of alkali metal and alkaline earth metal or lanthanoid. Also, as a material of the electron transport layer 137, there may be used a known metal complex such as Alq3 below, and benzoimidazole derivatives.

Alq3

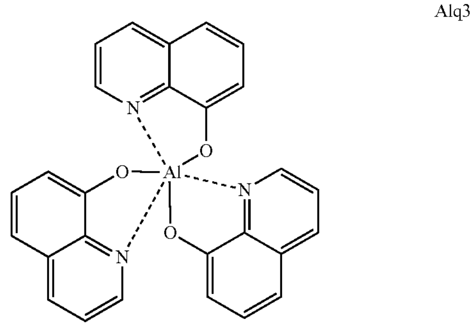

The mixture layer 141 is an N-type doped layer having the function of injecting electrons into a layer adjacent to a side of the anode 120 to the mixture layer 141. Specifically, the mixture layer 141 contains a chelate material, and alkali metal, alkaline earth metal and compounds thereof. Note that the alkali metal or the alkaline earth metal contained in the mixture layer 141 is preferably lithium (Li) or cesium (Cs).

Here, the mixture ratio between the chelate material and the alkali metal or the alkaline earth metal is preferably 1:5 to 2:1 in a molar ratio. A high ratio of the alkali metal or the alkaline earth metal causes charges to be likely to excessively diffuse, thus is not preferable. Also, a ratio of the alkali metal or the alkaline earth metal being less than the above-described range inhibits the generation of electrons to be injected into a layer adjacent to a side of the anode 120 to the mixture layer 141, thus is not preferable.

As the chelate material to be used in the mixture layer 141, there can be used any known chelate material as long as it can coordinate alkaline earth metal or alkali metal. An example of the chelate material to be used in the mixture layer 141 may include phenanthroline derivatives.

The acceptor layer 143 is a layer having the function of generating holes by voltage application, and injecting the generated holes to a layer adjacent to a side of the cathode 160 to the mixture layer 141. Specifically, the acceptor layer 143 contains an acceptor material. Note that examples of the acceptor material contained in the acceptor layer 143 to be used may include a known oxide semiconductor such as molybdenum oxide ($MoO_3$), and azatriphenylene derivatives.

By providing the charge generating layer 140 including the mixture layer 141 and the acceptor layer 143 as described above, there can be achieved sufficient and favorable charge balance to the first light-emitting unit 130 and the second light-emitting unit 150. Therefore, the organic electroluminescent element 100 according to an embodiment of the present disclosure can achieve high light-emitting efficiency and stable drive.

The electron injection barrier removal layer 155 is a layer that performs the function of removing an energy barrier between the cathode 160 and the second light-emitting layer 153 to increase the electron injection efficiency into the second light-emitting layer 153. Examples of a compound to be used for formation of the electron injection barrier removal layer 155 may include a compound containing an oxide, composite oxide and fluoride material of alkali metal or alkaline earth metal, as well as the compounds used in the N-type doped layer that forms the mixture layer 141.

Here, in the organic electroluminescent element 100 according to an embodiment of the present disclosure, the total film thickness of the layers present between the first light-emitting layer 135 and the second light-emitting layer 153 (that is, a sum of the film thicknesses of the electron transport layer 137, the mixture layer 141, the acceptor layer 143 and the second hole transport layer 151) is preferably not less than 15 nm and not more than 50 nm. When the total film thickness of the layers present between the first light-emitting layer 135 and the second light-emitting layer 153 is within the above-described range, supply of electrons into the first light-emitting unit can be further improved, thus further preventing the change in color taste of the emitted light color of the organic electroluminescent element 100 in a low current density.

That is, when the total film thickness of the layers present between the first light-emitting layer 135 and the second light-emitting layer 153 exceeds 50 nm, supply of electrons from the cathode 160 into the first light-emitting unit decreases by the layers present between the first light-emitting layer 135 and the second light-emitting layer 153. This causes the change in color taste of the emitted light color of the organic electroluminescent element 100 in a low current density to become difficult to be prevented, and thus is not preferable. On the other hand, the total film thickness of the layers present between the first light-emitting layer 135 and the second light-emitting layer 153 being less than 15 nm causes the original functions held by the layers present between the first light-emitting layer 135 and the second light-emitting layer 153 to deteriorate, and thus is not preferable.

Note that the organic electroluminescent element 100 according to an embodiment of the present disclosure is not limited to the structure described above. For example, in the organic electroluminescent element 100 according to an embodiment of the present disclosure, each of the layers described above may be formed as a single layer, or may be formed as multiple layers. Also, the organic electroluminescent element 100 according to an embodiment of the present disclosure may further include a layer other than the layers described above.

3. PRODUCTION METHOD OF ORGANIC ELECTROLUMINESCENT ELEMENT

Next, a production method of the above-described organic electroluminescent element 100 according to an embodiment of the present disclosure will be described.

Of the layers constituting the organic electroluminescent element 100 according to an embodiment of the present disclosure, the anode 120 and the cathode 160 can be formed by, for example, a deposition method including an electron beam deposition method, a hot filament deposition method and a vacuum deposition method, a sputtering method, a combination of a chemical vapor growth method (a CVD method) or an ion plating method and an etching method, various printing methods such as a screen printing method, an ink jet printing method and a metal mask printing method, a plating method (an electroplating method and an electroless plating method), a lift-off method, a laser ablation method, and a sol-gel method.

By various printing methods and a plating method, the anode 120 and the cathode 160 having a desired shape (pattern) can be directly formed. Note that when electrodes such as the anode 120 and the cathode 160 are formed after the formation of organic layers such as the first light-emitting unit 130, the charge generating layer 140 and the second light-emitting unit 150, there are more preferably used a film formation method, such as a vacuum vapor deposition method, in which the energy of film forming particles is small, and a film formation method such as a sputtering method. By such production methods, occurrence of damage to the organic layers such as the first light-emitting unit 130, the charge generating layer 140 and the second light-emitting unit 150 can be prevented when forming the electrodes.

Also, of the layers constituting the organic electroluminescent element 100 according to an embodiment of the present disclosure, the layers constituting the organic layers such as the first light-emitting unit 130, the charge generating layer 140 and the second light-emitting unit 150 can be formed by, for example, a physical vapor deposition growth method (a PVD method) such as a vacuum vapor deposition method, a printing method such as a screen printing method and an ink-jet printing method, a laser transfer method, and a coating method such as a spin coat method.

Furthermore, the processing from the formation of organic layers such as the first light-emitting unit 130, the charge generating layer 140 and the second light-emitting unit 150 to the formation of the anode 120 and the cathode 160 is preferably performed without being exposed to the atmosphere. By such a production method, the organic layers such as the first light-emitting unit 130, the charge generating layer 140 and the second light-emitting unit 150 can be prevented from deteriorating due to the moisture in the atmosphere.

Note that the above-described production method of the organic electroluminescent element 100 has been indicated as an example, and a production method of the organic electroluminescent element 100 according to an embodiment of the present disclosure is not limited to the above-described method.

4. EXAMPLES

Hereinafter, examples of the organic electroluminescent element 100 according to an embodiment of the present disclosure will be described.

Example 1

First, on the substrate 110 constituted by a glass substrate, there was manufactured a cell for an organic electroluminescent element, by forming an aluminum (Al) layer as the anode 120 with a film thickness of 200 nm by a vacuum vapor deposition method, and then masking a region other than a 2 mm×2 mm light-emitting region with an insulating film by $SiO_2$ deposition.

As indicated in Table 1 below, on the anode 120 of the manufactured cell, hexanitrile azatriphenylene (HAT) below as the hole injection layer 131 was formed with a film thickness of 10 nm by a vacuum vapor deposition method.

HAT

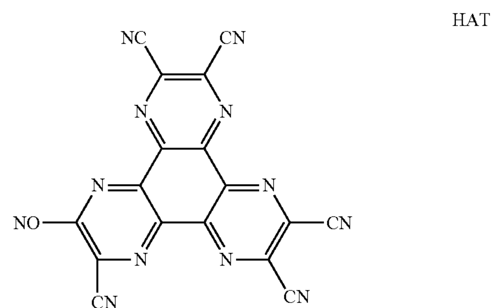

Next, on the hole injection layer 131, α-naphthyl phenyl phenylenediamine (α-NPD) below as the first hole transport layer 133 was formed with a film thickness of 120 nm by a vacuum vapor deposition method.

α-NPD

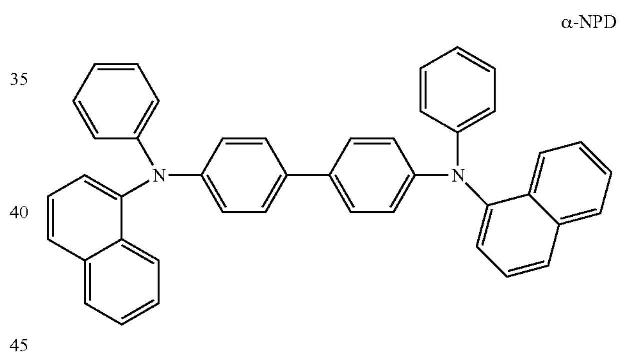

Subsequently, on the first hole transport layer 133, the first light-emitting layer 135 including Compound B1 below as a host and Compound B2 below as a dopant was formed with a total film thickness of 30 nm to obtain a film thickness ratio of 5% by a vacuum vapor deposition method. Note that the first light-emitting layer 135 was formed as a blue light-emitting layer.

Compound B1

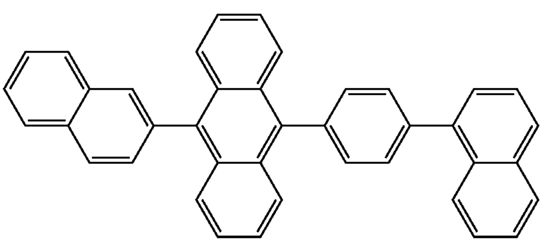

-continued

Compound B2

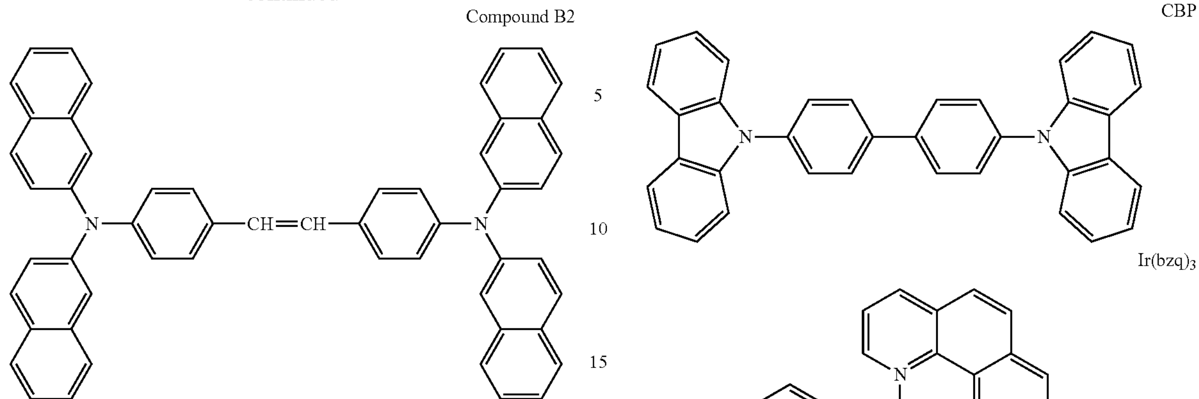

Next, on the first light-emitting layer 135, Compound ETL below as the electron transport layer 137 was formed with a film thickness of 20 nm by a vacuum vapor deposition method.

Compound ETL

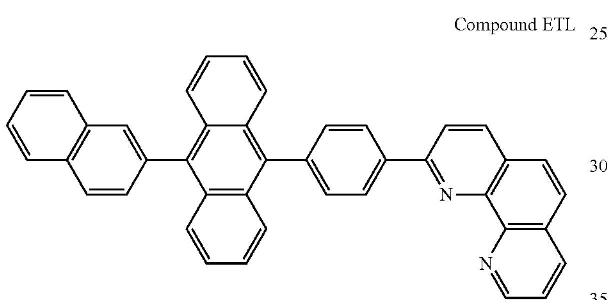

Subsequently, on the electron transport layer 137, a layer containing bathocuproine (BCP) below and lithium (Li) as the mixture layer 141 was formed with a film thickness of 10 nm to have a molar ratio between BCP and Li of 1:1 by a vacuum vapor deposition method.

BCP

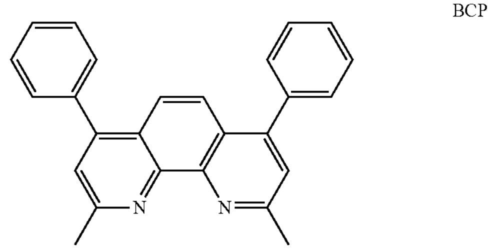 [SMILES: Cc1cc(-c2ccccc2)c2ccc3c(-c4ccccc4)cc(C)nc3c2n1]

Next, on the mixture layer 141, HAT as the acceptor layer 143 was formed with a film thickness of 10 nm by a vacuum vapor deposition method. Also, on the acceptor layer 143, α-NPD as the second hole transport layer 151 was formed with a film thickness of 10 nm.

Subsequently, on the second hole transport layer 151, a film including CBP below as a host and $Ir(bzq)_3$ below as a dopant was formed with a film thickness of 30 nm to obtain a film thickness ratio of 5% by a vacuum deposition method, and a layer containing CBP was formed with a film thickness of 10 nm on the formed film, thereby to obtain the second light-emitting layer 153. Note that the second light-emitting layer 153 was formed as a yellow light-emitting layer.

$Ir(bzq)_3$

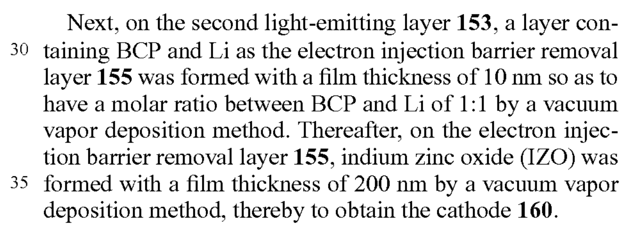

Next, on the second light-emitting layer 153, a layer containing BCP and Li as the electron injection barrier removal layer 155 was formed with a film thickness of 10 nm so as to have a molar ratio between BCP and Li of 1:1 by a vacuum vapor deposition method. Thereafter, on the electron injection barrier removal layer 155, indium zinc oxide (IZO) was formed with a film thickness of 200 nm by a vacuum vapor deposition method, thereby to obtain the cathode 160.

Example 2

An organic electroluminescent element was manufactured in a similar manner to Example 1, except that: the first hole transport layer 133 was formed with a film thickness of 30 nm; Nhost 1 below and Li were used to form a film with a film thickness of 70 nm so as to have a molar ratio of 1:1 in the mixture layer 141; and Nhost 1 below and Li were used to form a film with a film thickness of 10 nm so as to have a molar ratio of 1:3 in the electron injection barrier removal layer 155.

Nhost1

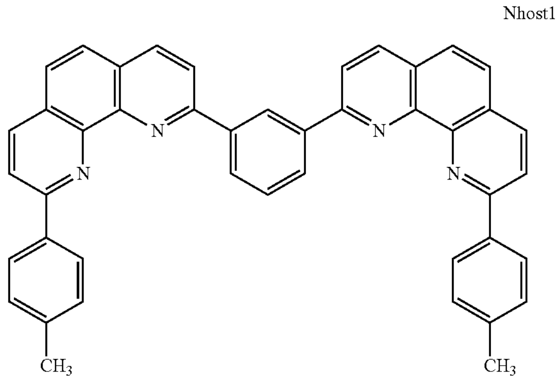 [SMILES: Cc1ccc(-c2ccc3ccc4ccc(-c5cccc(-c6ccc7ccc8ccc(-c9ccc(C)cc9)nc8c7n6)c5)nc4c3n2)cc1]

Example 3

An organic electroluminescent element was manufactured in a similar manner to Example 1, except that the electron transport layer 137 was formed with a film thickness of 5 nm.

Example 4

An organic electroluminescent element was formed in a similar manner to Example 1, except that: the first hole transport layer 133 was formed with Compound HTL below with a film thickness of 160 nm; a film of CBP and Ir(bzq)$_3$ was formed with a film thickness of 30 nm so as to have a film thickness ratio of 5% in order to have the first light-emitting layer 135 as a yellow light-emitting layer, and a layer containing CBP was formed with a film thickness of 5 nm on the formed film without forming the electron transport layer 137; and a layer containing Compound B1 and Compound B2 was formed with a film thickness of 30 nm in order to have the second light-emitting layer 153 as a blue light-emitting layer.

Compound HTL

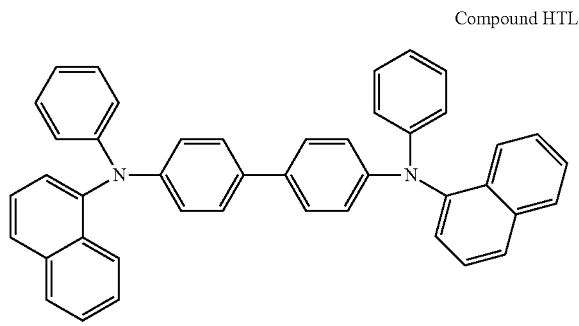 [SMILES: c1ccc(N(c2ccc(-c3ccc(N(c4ccccc4)c4cccc5ccccc45)cc3)cc2)c2cccc3ccccc23)cc1]

Example 5

An organic electroluminescent element was manufactured in a similar manner to Example 1, except that: the first hole transport layer 133 was formed with Compound HTL with a film thickness of 120 nm; the electron transport layer 137 was formed with a film thickness of 5 nm; the mixture layer 141 was formed with Nhost 1 and Li so as to have a molar ratio of 1:1 with a film thickness of 10 nm; the second hole transport layer 151 was formed with Compound HTL with a film thickness of 10 nm; and the electron injection barrier removal layer 155 was formed with Nhost1 and Li so as to have a molar ratio of 1:3 with a film thickness of 10 nm.

Comparative Example 1

An organic electroluminescent element was manufactured in a similar manner to Example 1, except that the electron transport layer 137, the mixture layer 141, the acceptor layer 143 and the second hole transport layer 151 were not formed.

Comparative Example 2

An organic electroluminescent element was manufactured in a similar manner to Example 4, except that: the first hole transport layer 133 was formed with α-NPD with a film thickness of 30 nm; and the second hole transport layer 151 was formed with α-NPD with a film thickness of 70 nm.

Comparative Example 3

An organic electroluminescent element was manufactured in a similar manner to Example 1, except that: the first hole transport layer 133 was formed with a film thickness of 30 nm; and the second hole transport layer 151 was formed with a film thickness of 70 nm.

Structures and film thicknesses of the layers of the organic electroluminescent elements according to Examples 1 to 5 and Comparative Examples 1 to 3 described above are collectively indicated in Table 1 below.

TABLE 1

| | | First light-emitting unit | | | | Charge generating layer | |
|---|---|---|---|---|---|---|---|
| | Anode | Hole injection layer | First hole transport layer | First light-emitting layer | Electron transport layer | Mixture layer | Acceptor layer |
| Example 1 | Al 200 nm | HAT 10 nm | α-NPD 120 nm | Compound B1 + Compound B2(5%) 30 nm | ETL 20 nm | BCP + Li 10 nm | HAT 10 nm |
| Example 2 | Al 200 nm | HAT 10 nm | α-NPD 30 nm | Compound B1 + Compound B2(5%) 30 nm | ETL 20 nm | Nhost1 + Li 70 nm | HAT 10 nm |
| Example 3 | Al 200 nm | HAT 10 nm | α-NPD 120 nm | Compound B1 + Compound B2(5%) 30 nm | ETL 5 nm | BCP + Li 10 nm | HAT 10 nm |
| Example 4 | Al 200 nm | HAT 10 nm | HTL 160 nm | CBP + Ir(bzq)$_3$(5%) 30 nm; CBP 5 nm | None | BCP + Li 10 nm | HAT 10 nm |
| Example 5 | Al 200 nm | HAT 10 nm | HTL 120 nm | Compound B1 + Compound B2(5%) 30 nm | ETL 5 nm | Nhost1 + Li 10 nm | HAT 10 nm |
| Comparative Example 1 | Al 200 nm | HAT 10 nm | α-NPD 120 nm | Compound B1 + Compound B2(5%) 30 nm | None | None | None |
| Comparative Example 2 | Al 200 nm | HAT 10 nm | α-NPD 30 nm | CBP + Ir(bzq)$_3$(5%) 30 nm; CBP 10 nm | None | BCP + Li 10 nm | HAT 10 nm |
| Comparative Example 3 | Al 200 nm | HAT 10 nm | α-NPD 30 nm | Compound B1 + Compound B2(5%) 30 nm | ETL 20 nm | BCP + Li 10 nm | HAT 10 nm |

TABLE 1-continued

| | Second light-emitting unit | | | | |
|---|---|---|---|---|---|
| | Second hole transport layer | Second light-emitting layer | | Electron injection barrier removal layer | Cathode |
| Example 1 | α-NPD 10 nm | CBP + $Ir(bzq)_3$(5%) 30 nm | CBP 10 nm | BCP + Li 10 nm | IZO 200 nm |
| Example 2 | α-NPD 10 nm | CBP + $Ir(bzq)_3$(5%) 30 nm | CBP 10 nm | Nhost1 + Li 10 nm | IZO 200 nm |
| Example 3 | α-NPD 10 nm | CBP + $Ir(bzq)_3$(5%) 30 nm | CBP 10 nm | BCP + Li 10 nm | IZO 200 nm |
| Example 4 | HTL 10 nm | Compound B1 + Compound B2(5%) 30 nm | | BCP + Li 10 nm | IZO 200 nm |
| Example 5 | HTL 15 nm | CBP + $Ir(bzq)_3$(5%) 30 nm | CBP 10 nm | Nhost1 + Li 10 nm | IZO 200 nm |
| Comparative Example 1 | None | CBP + $Ir(bzq)_3$(5%) 30 nm | CBP 10 nm | BCP + Li 10 nm | IZO 200 nm |
| Comparative Example 2 | α-NPD 70 nm | Compound B1 + Compound B2(5%) 30 nm | | BCP + Li 10 nm | IZO 200 nm |
| Comparative Example 3 | α-NPD 70 nm | CBP + $Ir(bzq)_3$(5%) 30 nm | CBP 10 nm | BCP + Li 10 nm | IZO 200 nm |

Example 6

Furthermore, an organic electroluminescent element according to Example 6 was manufactured with the structures and film thicknesses of the layers indicated in Table 2 below, in a similar method to Example 1. The organic electroluminescent element according to Example 6 is an organic electroluminescent element further including a third light-emitting unit that emits red light, and including three light-emitting units, compared to the organic electroluminescent elements according to Examples 1 to 5.

The organic electroluminescent element according to Example 6 differs from Example 5, in that: the second light-emitting layer 153 was formed with CBP and $Ir(bzq)_3$ so as to have a film thickness ratio of 5% with a film thickness of 30 nm; the second hole transport layer 151 was formed with film thickness of 10 nm; and a second charge generating layer including a second mixture layer and a second acceptor layer, a third hole transport layer and a third light-emitting layer were formed between the second light-emitting layer 153 and the electron injection barrier removal layer 155. Note that in Example 6, in order to distinguish from the second charge generating layer, the charge generating layer 140 between the first light-emitting unit 130 and the second light-emitting unit 150 is referred to as a first charge generating layer; the mixture layer 141 is referred to as a first mixture layer; and the acceptor layer 143 is referred to as a first acceptor layer.

Here, the structures and film thicknesses of the second mixture layer and the second acceptor layer in the second charge generating layer are similar to those of the mixture layer 141 and the acceptor layer 143 in the first charge generating layer (that is, the charge generating layer 140 in Example 5). Also, the third hole transport layer was formed with Compound HTL with a film thickness of 10 nm, and the third light-emitting layer was formed with Compound R1 below as a host and Compound R2 below as a dopant by a vacuum vapor deposition method with a film thickness of 20 nm.

Compound R1

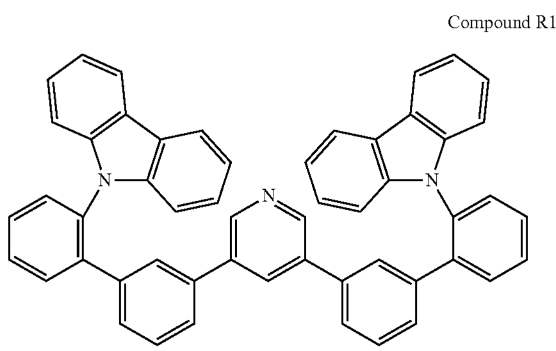

Compound R2

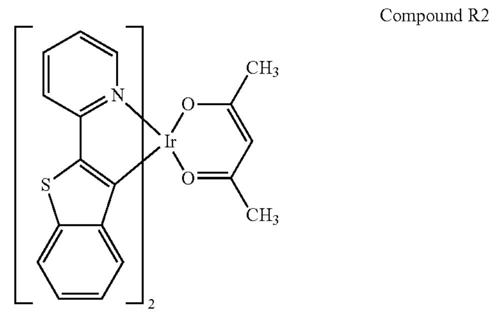

TABLE 2

| | Anode | First light-emitting unit: Hole injection layer | First light-emitting unit: First hole transport layer | First light-emitting unit: First light-emitting layer | First light-emitting unit: Electron transport layer | First charge generating layer: First mixture layer | First charge generating layer: First acceptor layer | Second light-emitting unit: Second hole transport layer | Second light-emitting unit: Second light-emitting layer |
|---|---|---|---|---|---|---|---|---|---|
| Example 6 | Al 200 nm | HAT 10 nm | HTL 120 nm | Compound B1 + Compound B2(5%) 30 nm | ETL 5 nm | Nhost1 + Li 10 nm | HAT 10 nm | HTL 10 nm | CBP + $Ir(bzq)_3$(5%) 30 nm |

| | Second charge generating layer: Second mixture layer | Second charge generating layer: Second acceptor layer | Third light-emitting unit: Third hole transport layer | Third light-emitting unit: Third light-emitting layer | Third light-emitting unit: Electron injection barrier removal layer | Cathode |
|---|---|---|---|---|---|---|
| Example 6 | Nhost1 + Li 10 nm | HAT 10 nm | HTL 10 nm | Compound R1 + Compound R2 20 nm | Nhost1 + Li 10 nm | IZO 200 nm |

(Evaluation Method and Result)

The light-emitting efficiency (cd/A) and the color coordinates (x, y) in each current density of 10 $mA/cm^2$ and 0.01 $mA/cm^2$ were measured for the organic electroluminescent elements according to Examples 1 to 6 and Comparative Examples 1 to 3 produced as described above. Also, the change ratio of the light-emitting efficiency (cd/A, X/J and Z/J) in a current density was calculated. Furthermore, after constant current drive at 10 $mA/cm^2$ was performed for 300 hours, the light-emitting efficiency (cd/A) and the color coordinates (x, y) were similarly measured, and the change ratio of the light-emitting efficiency (cd/A, X/J and Z/J) in a current density was calculated.

Here, the measured color coordinates (x, y) are color coordinates in the xyY color system. Also, X/J is a value obtained by converting color coordinates (x, y) in the xyY color system into color coordinates (X, Y, Z) in the XYZ color system, and dividing X of the converted color coordinates by a current density J. Furthermore, Z/J is a value obtained by converting color coordinates (x, y) in the xyY color system into color coordinates (X, Y, Z) in the XYZ color system, and dividing Z of the converted color coordinates by a current density J. Note that since the color coordinate Z in the XYZ color system is a value indicating the degree of bluishness, Z/J is a parameter comparable to the light-emitting efficiency cd/A when attention is paid on a blue component.

Also, the light-emitting efficiency ratio (cd/A) in a current density indicated in Table 3 is a rate, expressed in percentage, obtained by dividing the light-emitting efficiency (cd/A) in 0.01 $mA/cm^2$ by the light-emitting efficiency (cd/A) in 10 $mA/cm^2$. Similarly, the light-emitting efficiency ratio (X/J) in a current density is a rate, expressed in percentage, obtained by dividing the light-emitting efficiency (X/J) in 0.01 $mA/cm^2$ by the light-emitting efficiency (X/J) in 10 $mA/cm^2$, and the light-emitting efficiency ratio (Z/J) in a current density is a rate, expressed in percentage, obtained by dividing the light-emitting efficiency (Z/J) in 0.01 $mA/cm^2$ by the light-emitting efficiency (Z/J) in 10 $mA/cm^2$.

The obtained results are indicated in Table 3 below. Note that in Example 6, since the second hole transport layer and the third hole transport layer have an identical film thickness, and the ratio of the film thickness of the second hole transport layer to the total film thickness of the second light-emitting unit and the ratio of the film thickness of the third hole transport layer to the total film thickness of the third light-emitting unit are identical, only the film thickness and the ratio in the second hole transport layer are indicated.

TABLE 3

| | Film thickness[nm] of second hole transport layer | Ratio [%] of film thickness of second hole transport layer to total film thickness of second light-emitting unit | Light-emitting efficiency [cd/A] in 10 $mA/cm^2$ | Color coordinates (x, y) in 0.01 $mA/cm^2$ | Color coordinates (x, y) in 10 $mA/cm^2$ | Light-emitting efficiency ratio [cd/A] [%] in current density |
|---|---|---|---|---|---|---|
| Example 1 | 10 | 16.7 | 61 | 0.329, 0.366 | 0.322, 0.358 | 96 |
| Example 2 | 10 | 16.7 | 55 | 0.333, 0.471 | 0.333, 0.471 | 92 |
| Example 3 | 10 | 16.7 | 60 | 0.334, 0.373 | 0.324, 0.359 | 93 |
| Example 4 | 10 | 20.0 | 40 | 0.242, 0.233 | 0.265, 0.277 | 90 |
| Example 5 | 15 | 23.1 | 58 | 0.340, 0.368 | 0.327, 0.351 | 93 |
| Example 6 | 10 | 25.0 | 75 | 0.384, 0.353 | 0.384, 0.353 | 92 |
| Comparative Example 1 | None | None | 23 | 0.382, 0.590 | 0.259, 0.345 | 300 |
| Comparative Example 2 | 70 | 63.6 | 52 | 0.224, 0.424 | 0.329, 0.466 | 20 |
| Comparative Example 3 | 70 | 58.3 | 51 | 0.173, 0.259 | 0.306, 0.395 | 80 |

TABLE 3-continued

| | Light-emitting efficiency ratio [X/J] [%] in current density | Light-emitting efficiency ratio [Z/J] [%] in current density | Light-emitting efficiency ratio [cd/A] [%] in current density after 300 hours | Light-emitting efficiencyratio [X/J] [%] in current density after 300 hours | Light-emitting efficiency ratio [Z/J] [%] in current density after 300 hours |
|---|---|---|---|---|---|
| Example 1 | 96 | 92 | 90 | 90 | 92 |
| Example 2 | 92 | 92 | 90 | 90 | 90 |
| Example 3 | 93 | 85 | 91 | 91 | 93 |
| Example 4 | 90 | 70 | 91 | 91 | 60 |
| Example 5 | 93 | 84 | 91 | 91 | 93 |
| Example 6 | 92 | 95 | 91 | 91 | 93 |
| Comparative Example 1 | 300 | 10 | 40 | 40 | 30 |
| Comparative Example 2 | 20 | 85 | 20 | 20 | 45 |
| Comparative Example 3 | 80 | 13 | 80 | 80 | 10 |

It is understood by referring to the results in Table 3 that in Examples 1 to 6, the ratio of the film thickness of the second hole transport layer 151 to the total film thickness of the second light-emitting unit 150 is within the range of this disclosure, thus suppressing the change of the color coordinates (x, y) due to the change in current density, compared to Comparative Examples 1 to 3. Also, it is understood that the light-emitting efficiency ratios (cd/A), (X/J) and (Z/J) in a current density are closer to 100% in Examples 1 to 6 than Comparative Examples 1 to 3, thus suppressing the change in color taste of the emitted light color due to the change in current density. Furthermore, it is understood that in Examples 1 to 6, the change in color taste of the emitted light color due to the change in current density is similarly suppressed even after 300 hours.

More specifically, it is understood that in Examples 1 to 6, the film thickness of the second hole transport layer 151 is within the range of not less than 3 nm and not more than 15 nm, thus suppressing the change in color taste of the emitted light color due to the change in current density in a current density, compared to Comparative Examples 1 to 3 being outside the previously-described range. Also, it is understood that in Examples 1 to 3, 5 and 6, the first light-emitting layer 135 is a blue light-emitting layer, thus further suppressing the change in color taste of the emitted light color due to the change in current density, compared to Example 4. Furthermore, it is understood that in Examples 1, 3, 5 and 6, the total film thickness between the first light-emitting layer 135 and the second light-emitting layer 153 is within the range of not less than 15 nm and not more than 50 nm, thus further improving light-emitting efficiency, compared to Example 2 being outside the previously-described range.

Here, it is understood that in Example 6, three light-emitting units are laminated to each other, thus improving the light-emitting efficiency in 10 mA/cm$^2$, compared to Examples 1 to 5. Also, it is understood that even when three light-emitting units are laminated to each other, the change in color taste of the emitted light color due to the change in current density can be suppressed by setting the ratio of the film thickness of the hole transport layer in each of the second light-emitting unit and the third light-emitting unit to be within the range of an embodiment of the present disclosure. Furthermore, it is understood that even when three light-emitting units are laminated to each other, the light-emitting efficiency can be improved by setting the total film thickness between the light-emitting layers (that is the total film thickness between the first light-emitting layer and the second light-emitting layer, and the total film thickness between the second light-emitting layer and the third light-emitting unit) to be not less than 15 nm and not more than 50 nm.

As understood from the above evaluation results, according to the organic electroluminescent element 100 according to an embodiment of the present disclosure, supply of electrons into the first light-emitting layer can be prevented from being inhibited by the second hole transport layer, thus preventing the change in color taste of the emitted light color in a low current density. Also, the organic electroluminescent element 100 according to an embodiment of the present disclosure can prevent the change in color taste of the emitted light color by controlling the film thickness of the second hole transport layer, thereby enabling the light extraction in the organic electroluminescent element 100 to be optimized more easily.

Note that the organic electroluminescent element 100 according to an embodiment of the present disclosure emits white light, and can be suitably used in, for example, a lighting device and a display apparatus, which are included in an embodiment of the present disclosure.

Although preferred embodiments of the present disclosure have been described above with reference to the accompanying drawings, the technical range of the present disclosure is not limited to such examples. It should be understood by those skilled in the art that various modifications, combinations, sub-combinations and alterations may occur depending on design requirements and other factors insofar as they are within the scope of the appended claims or the equivalents thereof.

Also, the effects described herein are merely illustrative and exemplary, and not limiting. That is, the technology according to the present disclosure can exert other effects that are apparent to those skilled in the art from the description herein, in addition to the above-described effects or in place of the above-described effects.

Additionally, the present technology may also be configured as below.

(1) An organic electroluminescent element including:

a plurality of light-emitting units including at least a first light-emitting unit containing at least a first light-emitting layer, and a second light-emitting unit containing at least a second light-emitting layer; and a charge generating layer disposed between the first light-emitting unit and the second light-emitting unit, wherein the first light-emitting unit is disposed between an anode and a cathode, wherein the second light-emitting unit is disposed between the first light-emitting unit and the cathode, and wherein a film thickness of a hole transport layer in the second light-emitting unit is not less than 10% and not more than 25% to a total film thickness of the second light-emitting unit.

(2) The organic electroluminescent element according to (1), wherein the first light-emitting layer and the second light-emitting layer are light-emitting layers having light-emitting wavelengths different from each other.

(3) The organic electroluminescent element according to (1) or (2), wherein the first light-emitting layer is a blue light-emitting layer.

(4) The organic electroluminescent element according to any one of (1) to (3), wherein a film thickness of a hole transport layer in the second light-emitting unit is not less than 3 nm and not more than 15 nm.

(5) The organic electroluminescent element according to any one of (1) to (4), wherein a total film thickness of layers present between the first light-emitting layer and the second light-emitting layer is not less than 15 nm and not more than 50 nm.

(6) The organic electroluminescent element according to any one of (1) to (5), wherein the charge generating layer includes an N-type doped layer that contains at least one or more compounds selected from the group including alkali metal, alkaline earth metal, and compounds of the alkali metal and the alkaline earth metal, and a P-type doped layer that contains an acceptor compound and is laminated on and adjacent to the N-type doped layer.

(7) A display apparatus containing the organic electroluminescent element according to any one of (1) to (6).

(8) A manufacturing method of an organic electroluminescent element, the method including:

disposing, on an anode, a first light-emitting unit containing at least a first light-emitting layer;

disposing, on the first light-emitting unit, a charge generating layer;

disposing, on the charge generating layer, a second light-emitting unit containing at least a second light-emitting layer; and disposing, on the second light-emitting unit, a cathode, wherein a film thickness of a hole transport layer in the second light-emitting unit is formed as being not less than 10% and not more than 25% to a total film thickness of the second light-emitting unit.

What is claimed is:

1. An organic electroluminescent element comprising:

a plurality of light-emitting units including at least a first light-emitting unit containing at least a first light-emitting layer, and a second light-emitting unit containing at least a second light-emitting layer; and a charge generating layer disposed between the first light-emitting unit and the second light-emitting unit, wherein the first light-emitting unit is disposed between an anode and a cathode, wherein the second light-emitting unit is disposed between the first light-emitting unit and the cathode, wherein a film thickness of a hole transport layer in the second light-emitting unit is not less than 10% and not more than 25% of a total film thickness of the second light-emitting unit, and wherein a total film thickness of layers present between the first light-emitting layer and the second light-emitting layer is not less than 15 nm and not more than 50 nm.

2. The organic electroluminescent element according to claim 1, wherein the first light-emitting layer and the second light-emitting layer are light-emitting layers having light-emitting wavelengths different from each other.

3. The organic electroluminescent element according to claim 2, wherein the first light-emitting layer is a blue light-emitting layer.

4. The organic electroluminescent element according to claim 1, wherein the film thickness of the hole transport layer in the second light-emitting unit is not less than 3 nm and not more than 15 nm.

5. The organic electroluminescent element according to claim 1, wherein the charge generating layer includes an N-type doped layer that contains at least one or more compounds selected from the group including alkali metal, alkaline earth metal, and compounds of the alkali metal and the alkaline earth metal, and a P-type doped layer that contains an acceptor compound and is laminated on and adjacent to the N-type doped layer.

6. A display apparatus containing the organic electroluminescent element according to claim 1.

7. A manufacturing method of an organic electroluminescent element, the method comprising:

disposing, on an anode, a first light-emitting unit containing at least a first light-emitting layer;

disposing, on the first light-emitting unit, a charge generating layer;

disposing, on the charge generating layer, a second light-emitting unit containing at least a second light-emitting layer; and disposing, on the second light-emitting unit, a cathode, wherein a film thickness of a hole transport layer in the second light-emitting unit is formed as being not less than 10% and not more than 25% of a total film thickness of the second light-emitting unit, and wherein a total film thickness of layers present between the first light-emitting layer and the second light-emitting layer is not less than 15 nm and not more than 50 nm.

8. The organic electroluminescent element according to claim 2, wherein the wavelengths different from each other correspond to colors complementary to each other.

9. The organic electroluminescent element according to claim 1, wherein the film thickness of the hole transport layer in the second light-emitting unit is not less than 16.7% and not more than 25% of the total film thickness of the second light-emitting unit.

10. The organic electroluminescent element according to claim 1, further comprising a third light-emitting unit disposed between the second light-emitting unit and the cathode.

11. The organic electroluminescent element according to claim 10, wherein a film thickness of a hole transport layer in the third light-emitting unit is not less than 10% and not more than 25% of a total film thickness of the third light-emitting unit.

12. The manufacturing method according to claim 7, wherein the first light-emitting layer and the second light-emitting layer are light-emitting layers having light-emitting wavelengths different from each other.

13. The manufacturing method according to claim 12, wherein the first light-emitting layer is a blue light-emitting layer.

14. The manufacturing method according to claim 12, wherein the wavelengths different from each other correspond to colors complementary to each other.

15. The manufacturing method according to claim 7, wherein the film thickness of the hole transport layer in the second light-emitting unit is not less than 3 nm and not more than 15 nm.

16. The manufacturing method according to claim 7, wherein the charge generating layer includes an N-type doped layer that contains at least one or more compounds selected from the group including alkali metal, alkaline earth metal, and compounds of the alkali metal and the alkaline earth metal, and a P-type doped layer that contains an acceptor compound and is laminated on and adjacent to the N-type doped layer.

17. The manufacturing method according to claim 7, wherein the film thickness of the hole transport layer in the second light-emitting unit is not less than 16.7% and not more than 25% of the total film thickness of the second light-emitting unit.

18. The manufacturing method according to claim 7, further comprising:

disposing, on the second light-emitting unit and before the cathode, a third light-emitting unit.

19. The manufacturing method according to claim 18, wherein a film thickness of a hole transport layer in the third light-emitting unit is not less than 10% and not more than 25% of a total film thickness of the third light-emitting unit.

20. A method of manufacturing a display apparatus, comprising the manufacturing method according to claim 7.

* * * * *